United States Patent [19]

Valenzuela

[11] Patent Number: 5,029,638
[45] Date of Patent: Jul. 9, 1991

[54] HIGH HEAT FLUX COMPACT HEAT EXCHANGER HAVING A PERMEABLE HEAT TRANSFER ELEMENT

[75] Inventor: Javier A. Valenzuela, Grantham, N.H.

[73] Assignee: Creare Incorporated, Hanover, N.H.

[21] Appl. No.: 383,979

[22] Filed: Jul. 24, 1989

[51] Int. Cl.⁵ .............................................. F28D 7/00
[52] U.S. Cl. .................................. 165/164; 165/185; 165/908; 361/385
[58] Field of Search ...................... 165/80.3, 185, 908, 165/80.4, 164; 361/383–385

[56] References Cited

U.S. PATENT DOCUMENTS

| | | | |
|---|---|---|---|
| 3,481,393 | 12/1969 | Chu | 361/385 X |
| 3,595,310 | 7/1971 | Burne et al. | 165/181 |
| 4,318,393 | 3/1982 | Goldstein | 126/438 |
| 4,359,181 | 11/1982 | Chisholm | 228/183 |
| 4,494,171 | 1/1985 | Bland et al. | 361/386 |
| 4,561,040 | 12/1985 | Eastman et al. | 361/385 |
| 4,729,060 | 3/1988 | Yamamoto et al. | 361/385 |
| 4,733,293 | 3/1988 | Gabuzda | 357/81 |
| 4,750,086 | 6/1988 | Mittal | 361/382 |
| 4,759,403 | 7/1988 | Flint et al. | 165/80.4 |
| 4,823,869 | 4/1989 | Arnold et al. | 165/185 |
| 4,896,719 | 1/1990 | O'Neill et al. | 165/170 |
| 4,910,642 | 3/1990 | Downing | 361/382 |

OTHER PUBLICATIONS

Tuckerman and Pease, High Performance Heat Sinking For VLSI, IEEE Electron Device Letters, vol. EDL-2, No. 5, May 1981, pp. 126–129.

Tuckeman and Pease, Ultrahigh Thermal Conductance Microstructures for 32nd Electronic Components Conference, 1982, IEEE Electron Device Letters, pp. 145–149.

Bland et al., A Compact High Density Cooler, SAE Technical Paper Series, Jul. 1983, pp. 1–12.

*Primary Examiner*—Allen J. Flanigan
*Attorney, Agent, or Firm*—Michael J. Weins

[57] ABSTRACT

The present invention is directed to a compact heat exchanger having a permeable heat transfer element. Fluid passes through the permeable element to passages which are provided at the interface between the permeable heat transfer element and a high thermal conductivity impervious element. Heat is transferred from the fluid to the permeable heat transfer element as the fluid flows through the permeable element. Heat is transferred to the impervious element from the permeable element and from the fluid as the fluid flows through the passages. Optionally a second fluid is in thermal communication with the impervious element.

17 Claims, 6 Drawing Sheets

HIGH HEAT FLUX COMPACT HEAT EXCHANGER HAVING A PERMEABLE HEAT TRANSFER ELEMENT

FIELD OF INVENTION

The present invention relates to a heat exchanger, and more particularly, to an improved compact heat exchanger having both a permeable heat transfer element and an impervious heat transfer element.

BACKGROUND

Heat exchangers which transfer heat to or from a single phase fluid, are referred to as single-phase heat exchangers and are used in a variety of applications, ranging from an air-cooled radiator in an automobile to the exotic water-to-ammonia heat exchanger in the living module of the space station. In addition to applications involving the transfer of heat between fluids, single phase gas and liquids are frequently used to remove waste heat from equipment, such as electronic devices, electric motors, internal combustion engines, and power plant condensers. Single phase heat exchangers are used in conjunction with power generation in such applications as pressurized water nuclear reactors and gas-cooled nuclear reactors to remove the energy from the nuclear fuel.

Conventional single-phase heat exchangers cannot achieve high heat fluxes with low pressure drops because of limitations in the heat transfer coefficient. Heat transfer coefficients in conventional single-phase heat exchangers are typically a factor of 10 to 100 less than in boiling or condensing heat exchangers.

Gas cooled heat exchangers are particularly limited in their heat flux capacity because gases have very low heat capacity per unit volume.

The physical size and/or the weight of a heat exchanger can be a burden in some applications. In these applications the heat transferred per unit weight, or per unit volume must be considered when selecting a heat exchanger. Compact heat exchangers are distinguished by having a relatively high mass and/or volume specific capacity when compared to conventional heat exchangers. The book entitled: "COMPACT HEAT EXCHANGERS" by William M. Kays and A. L. London, McGraw-Hill 1964, is a standard reference for the design and performance analysis of compact heat exchangers. The definitions and terminology used herein will be consistent with those used in "COMPACT HEAT EXCHANGERS."

Compact heat exchangers are used in applications where it is desired to reduce the weight and/or volume of the heat exchanger. Compact heat exchangers usually have multiple fluid paths within a confined space to increase the area of the heat exchange surface relative to the volume or the weight of the heat exchanger. Increasing the area by creating multiple fluid paths is frequently achieved by the use of fins.

Alternatively, some compact heat exchangers employ porous heat transfer surfaces to increase the surface area over which the heat transfer fluid passes.

D. B. Tuckerman and R. F. W. Pease in an article entitled HIGH-PERFORMANCE HEAT SINK FOR VLSI, IEEE Electron Device Letters Vol. EDL-2, NO. 5, May 1981, pp 126–29, discuss the use of fins attached to a VLSI substrate. Closely spaced fins are attached to the substrate and fluid is passed by the fins flowing parallel to the substrate. The fins are effective in transferring heat but result in large pressure drops in the fluid.

A number of prior art patents are directed to various aspects of compact heat exchangers. U.S. Pat. No. 3,595,310 of Frederic A. Bernie and Emery I. Valyi entitled MODULAR UNITS AND USE THEREOF IN HEAT EXCHANGERS teaches and claims a modular heat exchanger element which comprises a tube which is in turn surrounded by a layer of porous heat conductive material. U.S. Pat. No. 3,595,310 suggests that the tube be formed of a metal and that the porous tube heat conductive material that surrounds the metal tube be formed of a high heat conductive material such as copper. The patent suggests forming a heat exchanger by combining pieces of the element formed from a soft tube surrounded by a porous material. The porous material is intended to increase the effective surface area in contact with the heat transfer fluid.

U S. Pat. No. 4,359,181 of John Chisholm entitled PROCESS FOR MAKING A HIGH HEAT TRANSFER SURFACE COMPOSED OF PERFORATED OR EXPANDED METAL teaches the process for making a heat transfer surface for a cross flow heat exchanger. The surface is formed by stacking layers of a porous metal lattice or woven material. The stacked material forms volumes having increased surface areas and these volumes are separated by an impervious interface. The flow is in a direction which is substantially parallel to the direction of the impervious interface.

U.S. Pat. No. 4,318,393 of Richard Goldstein entitled POROUS SURFACE SOLAR ENERGY RECEIVERS teaches a porous surface receiver for collecting reflected solar radiation. Air is employed as the heat transfer fluid is passed through the porous surface which is heated by the reflected solar radiation. The patent requires that the air pass through the heat transfer element, does not employ an impervious heat transfer element, and would not be suitable for transferring heat from a solid heat sink.

U.S. Pat. No. 4,494,171 of Timothy J. Bland and Richard E. Niggerman entitled IMPINGEMENT COOLING APPARATUS FOR HEAT LIBERATING DEVICE discloses a heat exchanger which uses a series of stacked plates with orifices therein. The plates are parallel to the heat sink which they cool. The orifices generate high velocity jets of the heat transfer fluid which increase the heat transfer but the orifices restrict the flow which results in large pressure drops as the fluid passes through the heat exchanger.

While the use of fins and/or porous material can increase the heat transfer by increasing the surface area, a large pressure drop in the heat transfer fluid will occur as the heat extracting fluid travels a long torturous path through the heat transfer surface.

Thus there is a need for a heat exchanger which will have high heat flux capability and operate with small pressure drops.

SUMMARY OF INVENTION

It is an object of the present invention to provide a single-phase heat exchanger with a high surface heat flux capability.

It is another object of the present invention to provide a compact heat exchanger in which the heat transfer fluid experiences only a small pressure drop as it passes through the heat exchanger.

Yet another object of the present invention is to provide a small and light heat exchanger having high effectiveness.

These and other objects of the present invention will become apparent to one skilled in the art from the following descriptions, figures, and claims.

The present invention is directed to a compact heat exchanger module having a permeable heat transfer element through which a heat transfer fluid passes. The permeable heat transfer element is joined to an impervious heat transfer element forming a permeable/impervious interface. The permeable/impervious interface provides a high thermal conductivity path there between. The permeable heat transfer element and the impervious heat transfer element are preferably fabricated from a high thermal conductivity material.

The permeable heat transfer element can be configured from closely spaced apart plates with the spaces there between providing passages for the heat transfer fluid. The plates are so positioned that the resulting passages are substantially normal to the impervious heat transfer element and means are provided for directing the flow through the passages substantially normal to the permeable/impervious interface.

Alternatively the permeable heat transfer element can be formed from rods, foamed metal, sintered metal powders or other structures which create passages substantially normal to the impervious heat transfer element.

Preferably the passages in the permeable heat transfer element have hydraulic diameters which are less than or equal to about 1 mm. The hydraulic diameter is defined as four times the cross sectional area of the passage divided by the perimeter of the cross section. For a circular cross section this results in the hydraulic diameter being the diameter of the circle.

Flow exit channels are provided which intercept the permeable/impervious interface. The channels communicate with the passages in the permeable element and provide for removal of the heat transfer fluid which passes through passages.

Preferably the channels provided which intercept the permeable/impervious interface are grooves in the impervious element. This configuration provides for maximum thermal contact between the permeable element and the impervious element.

In the heat exchanger of the present invention the fluid experiences a small pressure drop relative to the pressure drop experienced in conventional compact heat exchangers because the path length through the permeable heat transfer element is relatively short, on the order of 1 to 5 mm and fluid velocity relatively low, on the order of a few cm/sec.

BEST MODE OF CARRYING THE INVENTION INTO PRACTICE

Figure 1:
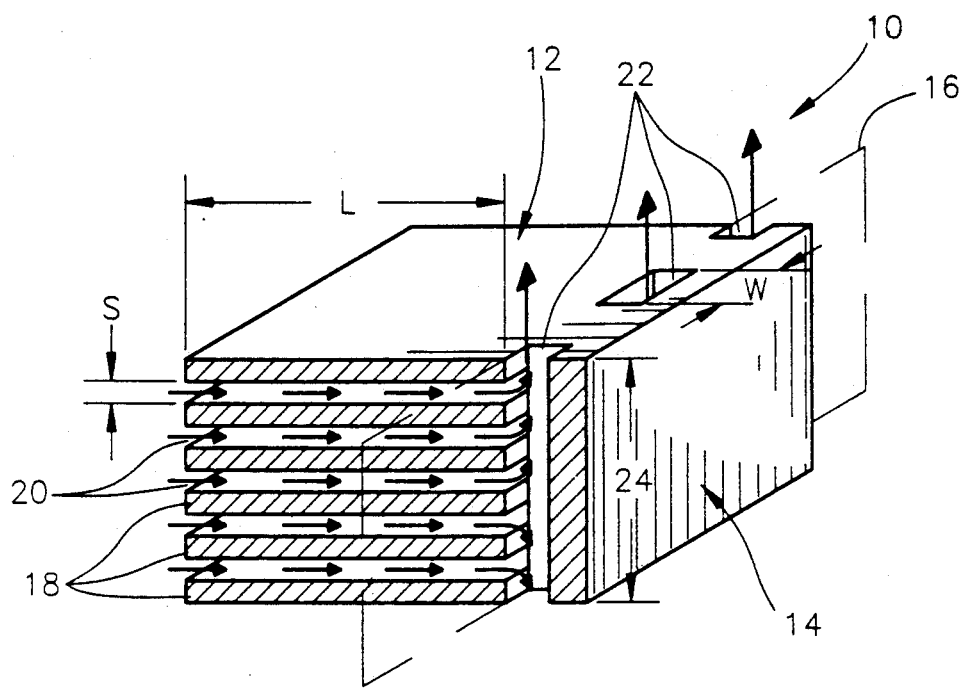
FIG. 1 is a schematic representation of a segment of a heat exchanger module for one embodiment of the present invention showing a portion of the permeable and impervious heat transfer elements and the permeable/impervious interface. The figure illustrates the flow path of the heat transfer fluid through the permeable and the impervious heat transfer elements.

FIG. 1 shows one embodiment of a heat exchanger module 10 of the present invention. The heat exchanger module 10 has a permeable heat transfer element 12 through which a heat transfer fluid flows. An impervious heat transfer element 14 joins the high thermal conductivity permeable heat transfer element 12 at a permeable/impervious interface 16.

The preferred materials for the impervious heat transfer element 14 and the permeable heat transfer element 12 are highly conductive materials such as metals like copper or aluminum when the operating temperatures are sufficiently low and the fluid does not interact with the metals resulting in corrosion products which foul the surface. For higher operating temperatures or when the heat transfer fluid will foul the surface, then higher melting point materials or more corrosion resistant materials such as stainless steel or graphite are preferred.

In the embodiment of FIG. 1 the permeable element 12 is formed by closely spaced apart plates 18. The spaces between the plates 18 form passages 20 which are substantially normal to the permeable/impervious interface 16.

Preferably the passages 20 of the permeable heat transfer element 12 have hydraulic diameters which are less than or equal to about 1 mm. The hydraulic diameter is defined as four times the cross sectional area of the passages divided by the perimeter of the cross section. For a series of closely spaced plates this would correspond to a separation of less than about 0.5 mm.

Figure 5:
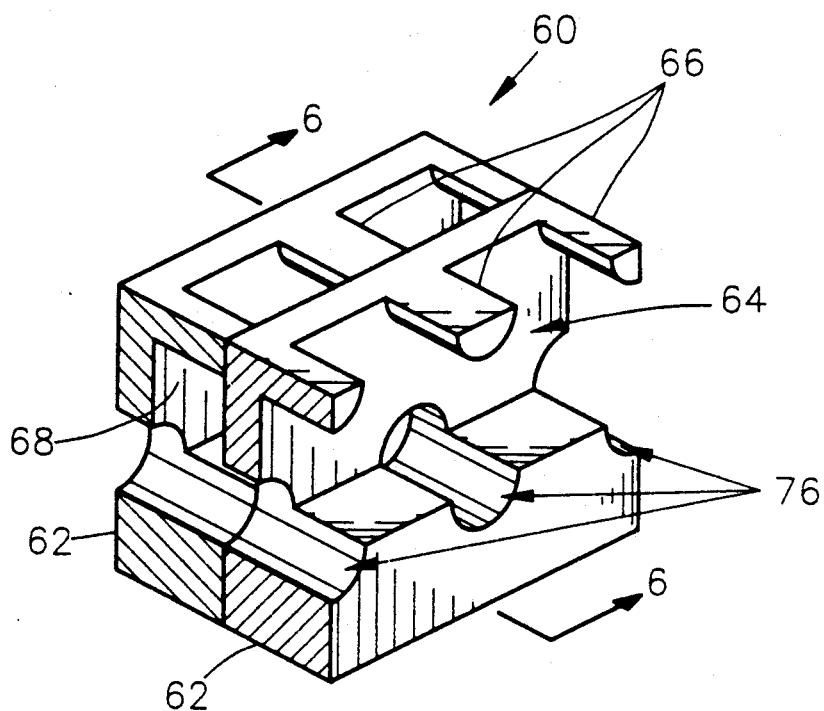
FIG. 5 is a heat exchanger module where the structure is produced by stacking plates which have been coined to provide recesses in their surfaces The coined plates are stacked so as to provide a permeable section and an impervious section. Circular channels pass through the stacked plates such that their diameters lie in the interface between the permeable section and the impervious section.

Channels 22 intersect the permeable/impervious interface 16 and communicate with passages 20 in the permeable element It is preferred that they lie in the impervious heat transfer element 14. This can readily be accomplished by employing rectangular channels 22 and where the permeable/impervious interface 16 is planar. When circular channels are employed to simplify fabrication as is illustrated in FIG. 5, then the diameter of the channel preferably lies in the permeable/impervious interface.

It is further preferred that the channels 22 intersect about one half of the porous/impervious interface 16 and that the channels 22 be sized such that they provide a hydraulic diameter which is at least an order of magnitude greater than the hydraulic diameter of the passages 20.

It is preferred that the length L of the passages 20 be greater than about three (3) times the hydraulic diameter of the channels 22. For square channels illustrated in FIG. 1 the hydraulic diameter becomes the width W of the channels, and the lengths L of the spaced apart plates 18 should be maintained greater than 3 W.

The length 24 of the channels 22 should preferably be maintained at less than about 2 cm so as to maintain uniform flow through all the passages.

Figure 2:
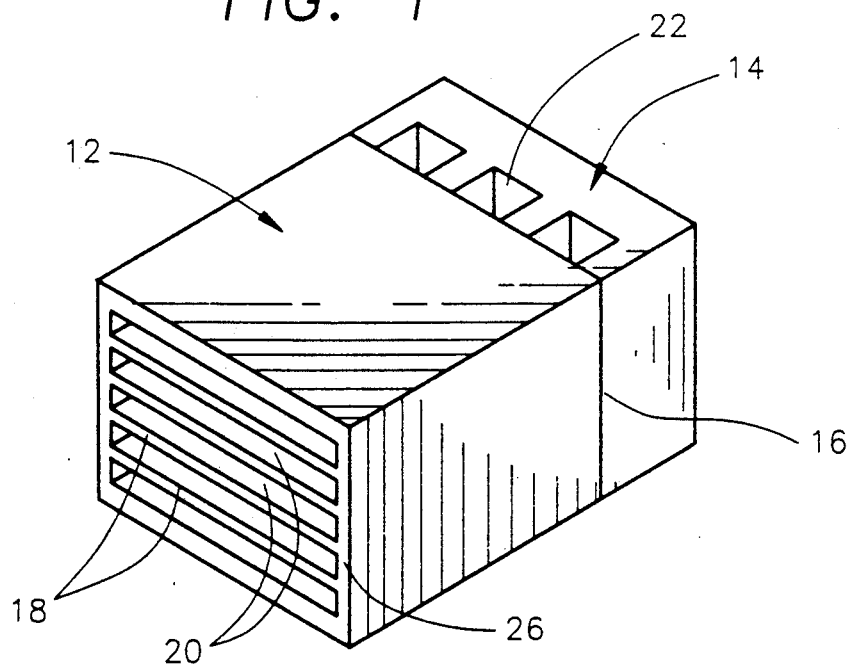
FIG. 2 is a schematic representation of the heat exchanger module of FIG. 1 showing the sidewalls which serve to direct the fluid normal to the permeable/impervious interface.

Referring to FIG. 2, which illustrates a module of FIG. 1 and illustrates the sidewalls 26 which are normal to the permeable/impervious interface 16 and close the passages 20 in the direction parallel to the permeable/impervious interface 16, the sidewalls 26 provide means to direct the heat transfer fluid flowing through the passages 20 substantially normal to the permeable/impervious interface 16.

Figure 3:
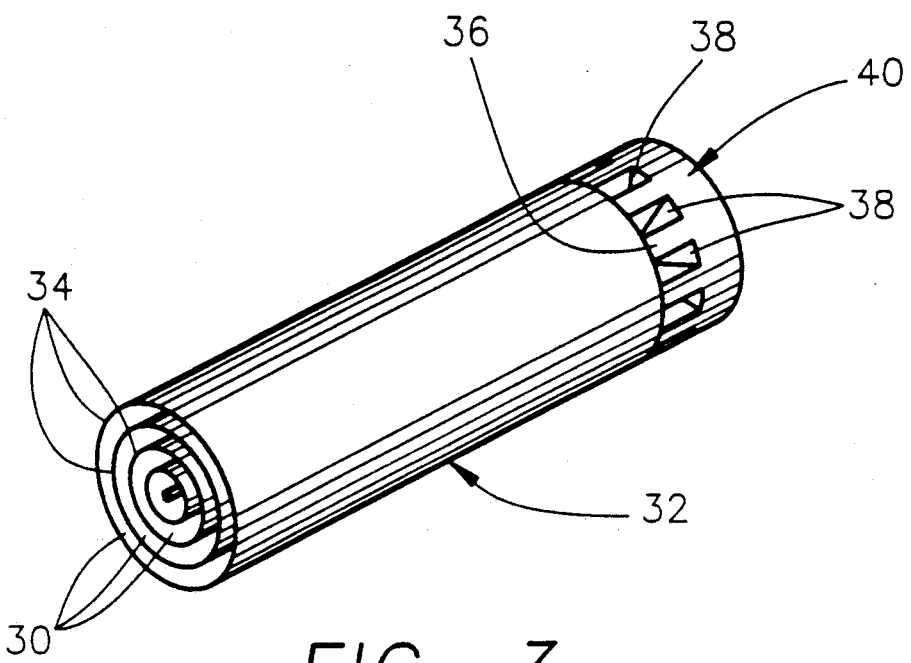
FIG. 3 is another embodiment of the present invention where the permeable element is formed from a series of concentric spaced apart walls.

FIG. 3 illustrates another configuration for the passages 30 in the permeable heat transfer element 32. In this embodiment the passages 30 form concentric rings which are separated by cylindrical plates 34. With this configuration the plates serve as means to direct the fluid through the passages 30 normal to the permeable/impervious interface 36. The fluid exits via the exit channels 38 which intersect the permeable/impervious interface 36 and reside in the impervious heat transfer element 40. While the permeable heat transfer element 32 has been illustrated as concentric rings, a coiled element will serve equally well as the permeable element and concentric rings will also be used to describe this geometry.

Figure 4:
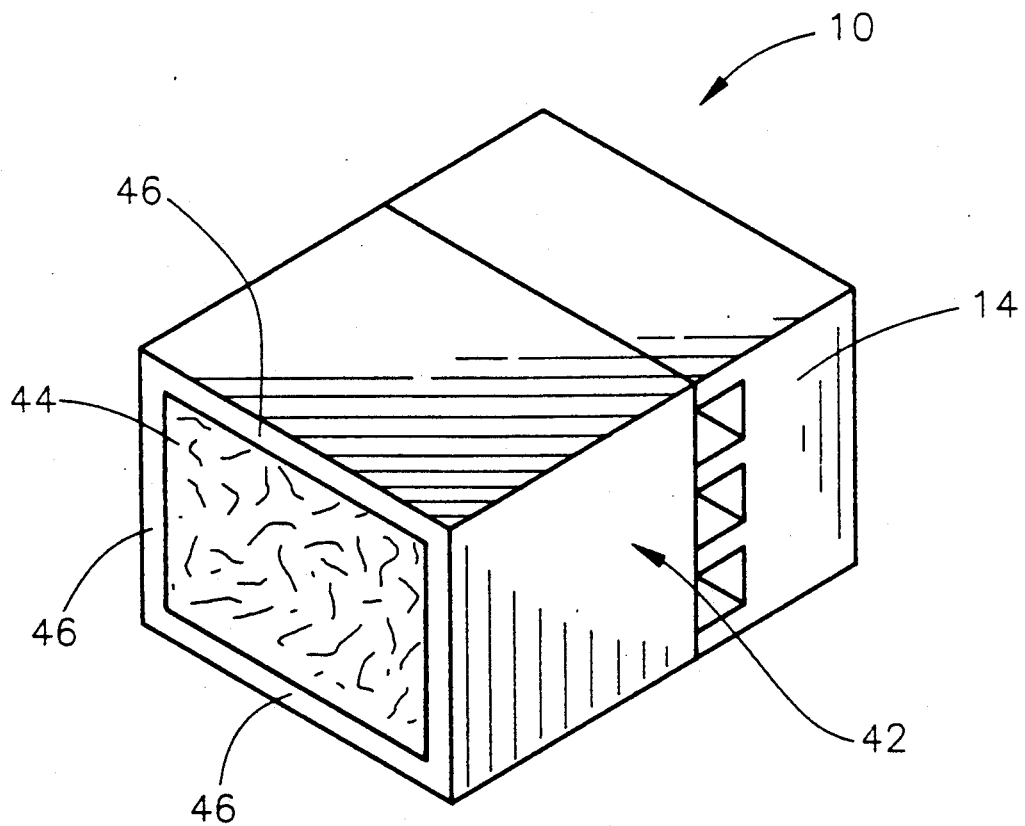
FIG. 4 is another embodiment of the present invention where permeable element is a porous material such as sintered powdered metal or foamed metal.

FIG. 4 illustrates another heat transfer module of the present invention having a permeable heat transfer element 42 constructed of a porous material such as foamed metal, or a sintered metal powder. These materials will have interconnected pores which will provide passages which are substantially normal to the impermeable heat transfer element 14. The path length of a pore in the permeable element is generally longer than the passages resulting from the permeable configurations discussed above. In general the length of the path will be about 1.5 the length of the permeable element. One or more sidewalls 46 surround the surfaces of the porous material 44 that are normal to the permeable/impervious interface. The sidewalls 46 provide means for directing the fluid through the porous material substantially normal to the permeable/impervious interface.

When such materials are employed for the permeable element then provisions must be made to assure the porous/impervious interface provides a highly conductive path between the high thermal conductivity porous heat transfer element 44 and the high thermal conductivity impervious heat transfer element 14.

If the permeable heat transfer element 12, as shown in FIG. 1, is a porous element 44 such as results from a sintered metal element or a foamed metal element, then the resulting pore size of less than about 0.5 mm should preferably be maintained.

While the size of an individual heat exchanger module 10 is limited, the modules can be coupled and allow the development of heat transfer surfaces of arbitrary size and shape.

Figure 6:
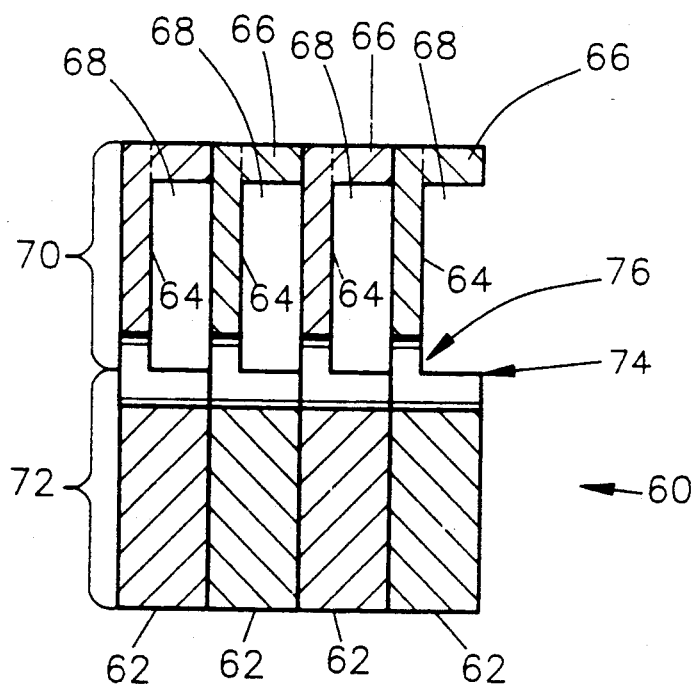
FIG. 6 is a cross section of the heat exchanger module of FIG. 5 which is assembled illustrating the permeable element and the impervious element.

FIG. 5 is a schematic representation of a heat exchanger module 60 formed by stacking plates 62. Each of the plates 62 is coined to form recessed regions 64 having bosses 66. When the plates are stacked as illustrated in FIG. 6 the recessed regions 64 form a series of passages 68 in the permeable segment 70 of the heat exchanger modular 60. The bosses 66 provide spacers to maintain uniform spacing of the passages 68. The segments of the stacked plates which are not coined form the impervious section 72. The permeable/impervious interface 74 is formed by the edges 74 of the recessed regions 64. Circular channels 76 are provided at the interface and intersects the interface such that the diameter of the cylindrical channel 76 lies in the interface 74.

Figure 7:
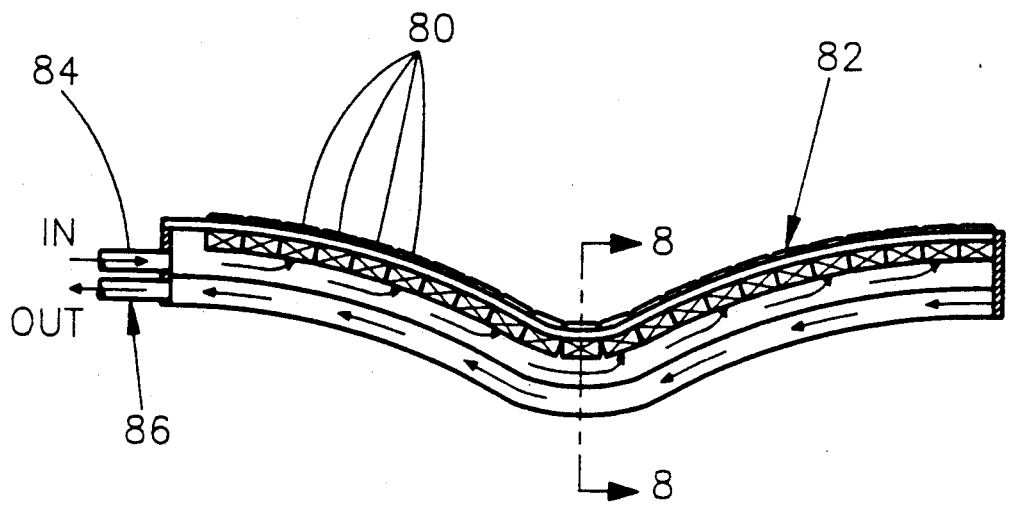
FIG. 7 is a schematic representation of a series of modules of FIG. 1 which are coupled to form an expanded heat transfer surface.

FIG. 7 illustrates a series of heat exchanger modules 80 which are coupled in a parallel arrangement to form an extended heat transfer surface 82. The heat exchanger modules 80 are attached to an inlet duct 84 and an outlet duct 86. The ducts and one of the heat exchanger modules are shown in FIG. 8.

The inlet duct 84 is positioned in the outlet duct 86. The inlet duct 84 is sealed to the heat exchanger modules 80 such that the fluid in the inlet duct 84 will flow through the passages 88 of the permeable element 90. The impervious element 92 of the module 80 attaches to the outlet duct 86. The channels 94 of the heat exchanger module 80 open into the outlet duct 86.

Figure 8:
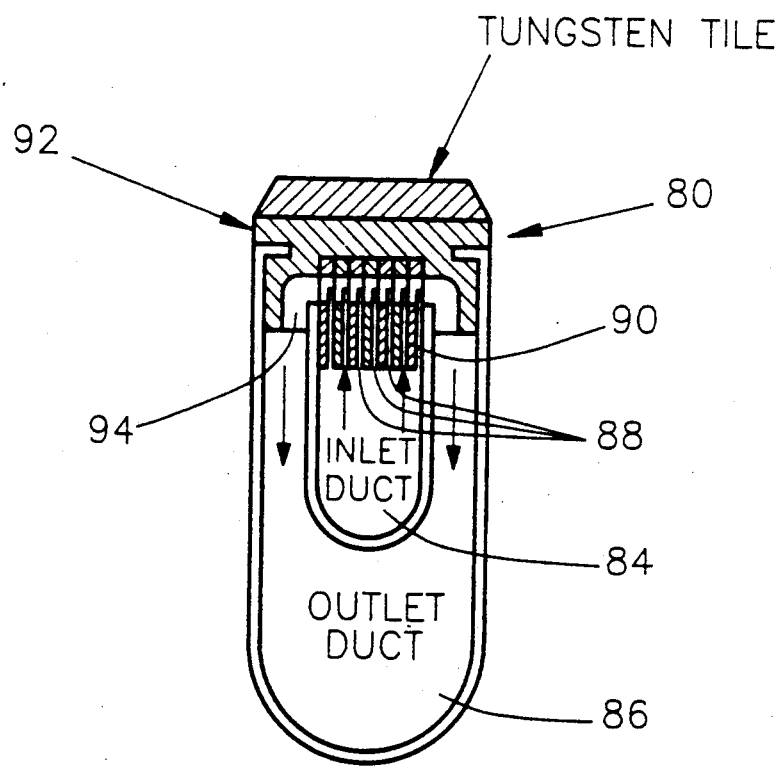
FIG. 8 is a section 8—8 of FIG. 7 illustrating the passages and channels of one of the modules of FIG. 7 and their connection to inlet and outlet fluid supply ducts.

By using a series of elements as illustrated in FIGS. 7 and 8 the heat transfer surface 82 need not be planar but may take on arbitrary shapes limited only by the size of the individual modules.

Figure 9:
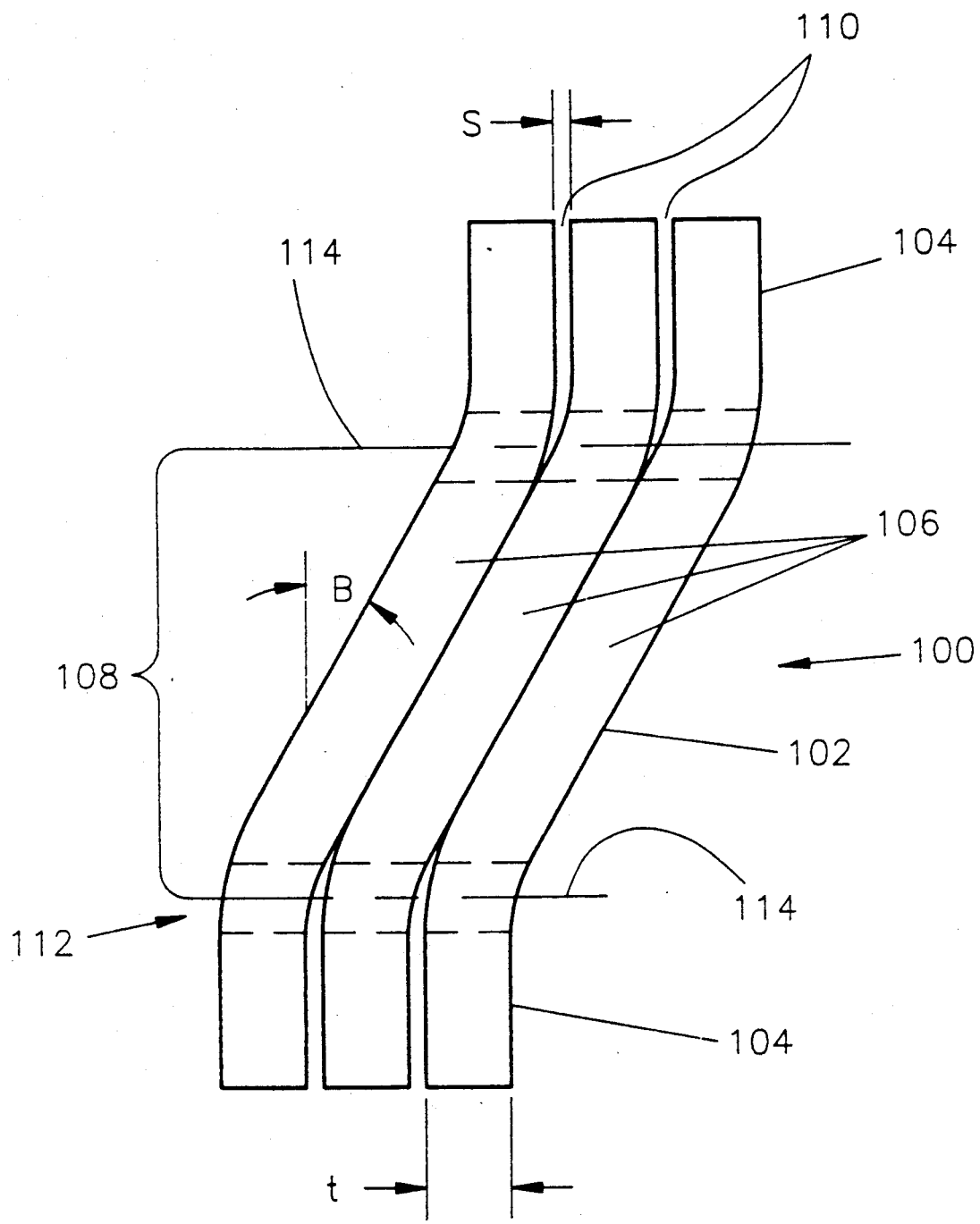
FIG. 9 is a schematic representation of the heat exchanger module of the present invention which is composed of stacked bent plates.

FIG. 9 is a schematic representation of an alternative embodiment of a heat exchanger of the present invention for use in a two fluid heat exchanger. The heat exchanger module 100 has an impervious element 102 and a permeable elements 104 extending therefrom. The heat exchanger 100 is formed from sheets 106 which are bent in two locations at an angle B. The bent sheets are stacked so as to have areas 108 in common contact. Bending the plates having a thickness t and stacking the plates creates a separation s which is:

$$t[\sec B - ]$$

The separation s provides passages 110 in the permeable elements 104. The areas 108 are preferably joined by brazing to form the impervious element 102. A series of aligned holes 112 are provided in the sheets 106. The holes 112 form passages at the interface 114 between the impervious element 102 and the permeable elements 104.

Figure 10:
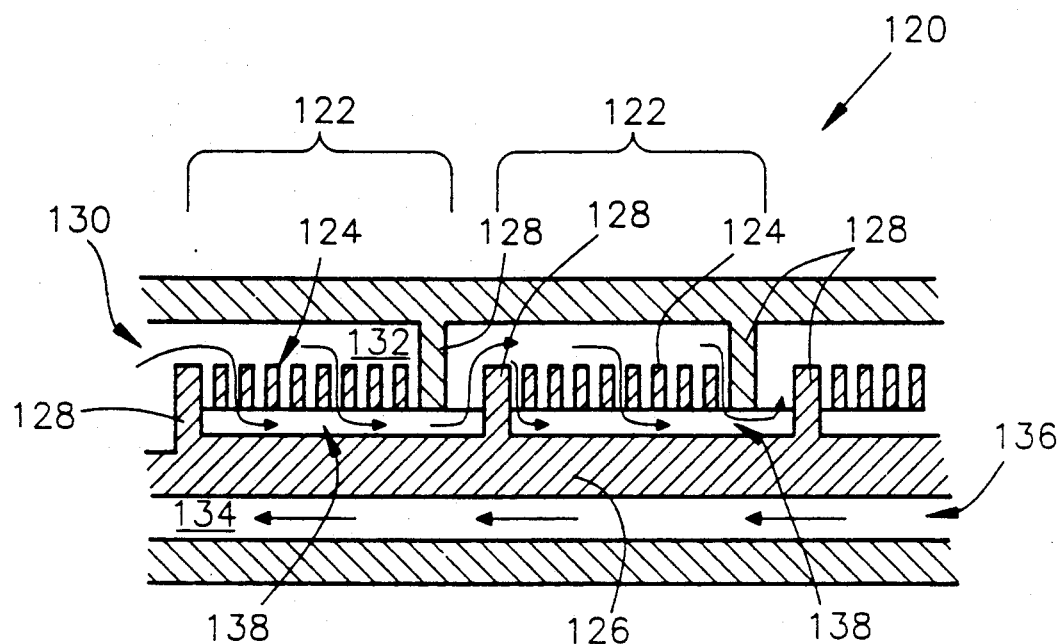
FIG. 10 is a schematic representation of a series of heat exchanger modules so connected to provide a quasi counter flow heat exchanger.

FIG. 10 shows a quasi counter flow heat exchanger 120 composed of heat exchanger modules connected in series. The heat exchanger 120 has heat exchanger modules 122. Each module 122 has permeable heat transfer elements 124. The modules 122 share a common impervious element 126. Partitions 128 separate the permeable heat transfer elements 122. A first duct 130 encloses the permeable heat transfer elements 124. A first fluid 132 flows through the first duct 130 above the impervious heat transfer element 126. A second heat transfer fluid 134 flows through a second duct 136 below the impervious heat transfer element 126. The first fluid 132 and the second fluid 134 flow in opposite directions thus creating a counter flow heat exchanger. The first fluid 132 flows through the permeable elements 126 into the channels 138 which are provided in the impervious element 126 and passes through the partition plates 128. The configuration of FIG. 10 provides for the output of the channels of one module providing the supply for the passages in the subsequent module.

Heat transfer between the second fluid 134 and the impervious heat transfer element 126 can be increased by providing fins (not shown) which extend into the second fluid 134, and thus increase the surface area contacted by the second fluid 134. Alternatively a series of permeable elements can be provided to increase the heat transfer.

Figure 11:
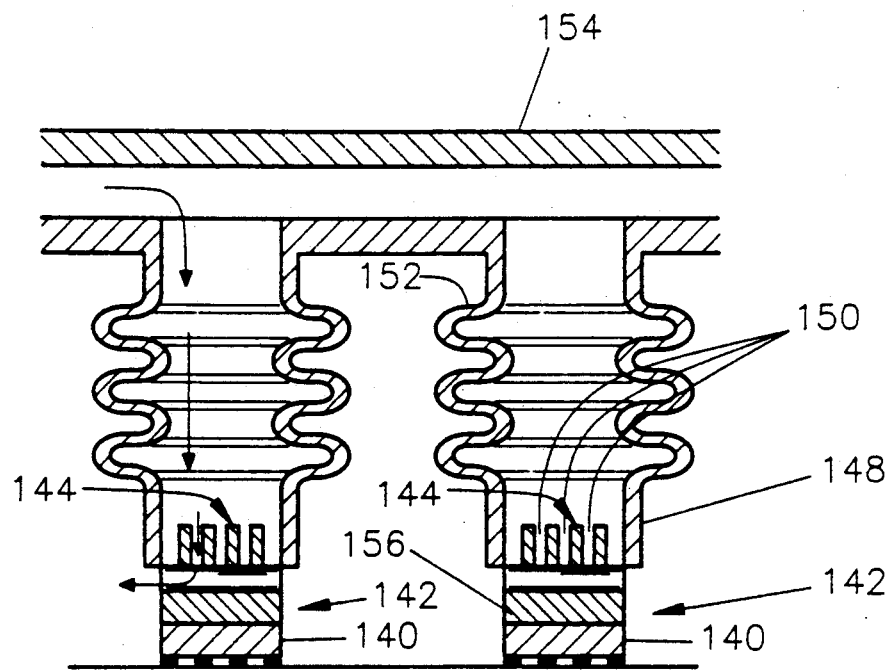
FIG. 11 is a schematic representation of a heat exchanger of the present invention for the cooling of semiconductor chips.

FIG. 11 illustrates another embodiment of the heat exchanger of the present invention which is designed for cooling of semiconductor chips 140. Permeable heat exchanger modules 142 such as is illustrated in FIG. 2 are employed for cooling semiconductor chips 140. The permeable heat transfer elements 144 of the permeable heat exchanger 142 is attached to tubing 148 and communicates with the passages 150 in the permeable heat exchange element 142. The tubing 148 directs air which serves as the coolant into the passages 150 substantially normal to the permeable/impervious interface 152. Attached to the tubing 148 are flexible bellows 152 which in turn attach to a fixed air supply line 154. The bellows 152 are of such a length so as to maintain a positive pressure on the semiconductor chip 140 by the impervious heat transfer element 156.

EXAMPLE

A heat exchanger module of the general configuration shown in FIG. 2 was fabricated out of a solid block of copper. The passages on the permeable element were machined to a 0.113 mm width and 3.48 mm depth using travelling wire EDM. Circular exit channels with a diameter of 1.53 mm were drilled in such a manner that the diameter of the channel intersected the bottom of the passages in the permeable element. The frontal area of the permeable element was 1 cm$^2$. The heat exchanger module was used to remove heat from an electrical resistance heater simulating the heat addition to the diverter plates in a fusion energy reactor. The heat transfer fluid was helium gas at an absolute pressure of 3.1 MPa (450 psia). Heat fluxes as high as 850 W/cm$^2$ were achieved with an effectiveness of 90%. The pressure drop in the heat exchanger was only 13 cm of water.

While the novel features of the present apparatus have been described in terms of particular embodiments and preferred applications, it should be appreciated by one skilled in the art that substitution of materials and details obviously can be made without departing from the spirit of the invention.

What I claim is:

1. A compact heat exchanger module comprising:
   an impervious heat transfer element;
   a permeable heat transfer element having one or more passages through which a heat transfer fluid passes, said passages being bound by one or more plates;
   a permeable/impervious interface where said impervious heat transfer element and said permeable heat transfer element are joined, said permeable/impervious interface being positioned such that said one or more plates are substantially normal to said permeable/impervious interface;
   channels communicating with said passages of said permeable heat transfer element at said permeable/impervious interface; and
   means for directing the fluid through said passages substantially normal to said permeable/impervious interface.

2. The compact heat exchanger or claim 1 wherein said one or more plates forms a series of closely spaced apart plates having spaces therebetween, said spaces forming said passages; and further wherein said means for directing the fluid passing through said passages substantially normal to said permeable/impervious interface further comprises:
   side walls attached to said closely spaced apart plates, said side walls being attached to said spaced apart plates and substantially normal to said permeable/impervious interface such that said side walls close said passages in the direction parallel to said permeable/impermeable interface.

3. The compact heat exchanger module of claim 2 wherein said passages have a hydraulic diameter of less than about 1 mm.

4. The compact heat exchanger module of claim 3 wherein said channels have a hydraulic diameter and said passages have a length greater than about three times said hydraulic diameter of said channels.

5. The compact heat exchanger module of claim 4 wherein said channels have a length not greater than about 2 cm.

6. The compact heat exchanger module of claim 2 further comprising spacers positioned between said plates of said permeable heat transfer element.

7. The compact heat exchanger module of claim 6 wherein said channels reside in said impervious element.

8. The compact heat exchanger module of claim 6 wherein said interface channels are cylindrical and are positioned such that their diameters reside in said interface.

9. A compact heat exchanger module comprising;
   an impervious heat transfer element;
   a permeable heat transfer element having passages through which a heat transfer fluid passes, said permeable element being a porous element having interconnected pores which form said passages;
   a permeable/impervious interface where said impervious heat transfer element and said permeable heat transfer element are joined;
   channels communicating with said passages of said permeable element at said permeable/impervious interface; and
   means for directing the fluid passing through said passages substantially normal to said permeable/impervious interface.

10. The compact heat exchanger module of claim 9 wherein said means for directing the fluid passing through said passages substantially normal to said permeable/impervious interface further comprises:
   at least one sidewall attached to said porous element, said sidewall terminating passages which run parallel to said permeable/impermeable interface.

11. The compact heat exchanger module of claim 10 wherein said passages have a hydraulic diameter of less than about 1 mm.

12. The compact heat exchanger module of claim 11 wherein said channels have a hydraulic diameter and said passages have a length not greater than about three times said hydraulic diameter of said channels.

13. The compact heat exchanger module of claim 10 wherein said interface is planar and said channels reside in said impervious element.

14. The compact heat exchanger module of claim 10 wherein said interface channels are cylindrical and are positioned such that their diameter resides in said interface.

15. A multi-module compact heat exchanger comprising:
   at last two modules, each of said modules having;
      an impervious heat transfer element,
      a permeable heat transfer element having passages through which a heat transfer fluid passes,
      a permeable/impervious interface where said impervious heat transfer element and said permeable heat transfer element are joined,
      channels communicating with said passages of said permeable medium at said interface, and
      means for directing the fluid passing through said passages substantially normal to said permeable/impervious interface;
   wherein said modules have a common impervious heat transfer element, said heat transfer modules being connected in series whereby said channels' output of the heat transfer fluid provides an input of heat transfer fluid for said passages in said permeable heat transfer element;
   a first duct enclosing said permeable heat transfer elements for directing the flow of a first heat transfer fluid;
   partitions in said duct separating said permeable heat transfer elements; and
   a second duct attached to said impervious heat transfer element providing a counter-flow of a second fluid.

16. The multi-mode compact heat exchanger of claim 15 wherein said permeable heat transfer element has one or more plates substantially normal to said permeable/impervious interface.

17. The multi-mode compact heat exchanger of claim 15 wherein said permeable heat transfer element is a porous element.

* * * * *